(12) United States Patent
Krestel et al.

(10) Patent No.: US 10,347,849 B2
(45) Date of Patent: Jul. 9, 2019

(54) SEQUENTIAL FUNCTIONALIZATION OF PHOSPHORESCENT EMITTER LAYERS

(71) Applicant: Siemens Aktiengesellschaft, Munich (DE)

(72) Inventors: Ana-Maria Krestel, Erlangen (DE); Guenter Schmid, Hemhofen (DE); Joachim Wecker, Roettenbach (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 388 days.

(21) Appl. No.: 15/316,242

(22) PCT Filed: Jun. 1, 2015

(86) PCT No.: PCT/EP2015/062085
§ 371 (c)(1),
(2) Date: Dec. 5, 2016

(87) PCT Pub. No.: WO2015/185482
PCT Pub. Date: Dec. 10, 2015

(65) Prior Publication Data
US 2018/0182979 A1    Jun. 28, 2018

(30) Foreign Application Priority Data
Jun. 5, 2014 (DE) .................. 10 2014 210 676

(51) Int. Cl.
*H01L 51/00* (2006.01)
*H01L 51/56* (2006.01)
(Continued)

(52) U.S. Cl.
CPC ......... *H01L 51/0077* (2013.01); *C09K 11/06* (2013.01); *H01L 51/001* (2013.01);
(Continued)

(58) Field of Classification Search
CPC ............ H01L 51/0077; H01L 51/0078; H01L 51/0079; H01L 51/009
See application file for complete search history.

(56) References Cited

U.S. PATENT DOCUMENTS

| 6,528,188 B1 | 3/2003 | Suzuki et al. ............... 428/690 |
| 7,943,244 B2 | 5/2011 | Aziz et al. ................... 428/690 |
| (Continued) | | |

FOREIGN PATENT DOCUMENTS

| CN | 106459744 A | 2/2017 | ............. C09K 11/06 |
| DE | 10360681 A1 | 7/2005 | ............. C09K 11/06 |
| (Continued) | | | |

OTHER PUBLICATIONS

Omary, Mohammad A. et al., "Enhancement of the Phosphorescence of Organic Luminophores Upon Interaction with a Mercury Trifunctional Lewis Acid," Inorganic Chemistry, vol. 42, No. 7, p. 2176-2178, Jan. 21, 2003.
(Continued)

*Primary Examiner* — Vu A Nguyen
(74) *Attorney, Agent, or Firm* — Slayden Grubert Beard PLLC

(57) ABSTRACT

A method is provided for producing phosphorescent emitter layers composed of at least one organic fluorescent emitter F and at least one metal complex K including organic complex ligands L and at least one heavy main group metal M selected from the group consisting of In, Tl, Sn, Pb, Sn and Bi. The organic fluorescent emitter F and the metal complex K may be individually deposited as layers on a substrate and subsequently reacted with each other, wherein the coordination sphere of the heavy main group metal M is changed by receiving the organic fluorescent emitter F.

15 Claims, 1 Drawing Sheet

(51) Int. Cl.
  C09K 11/06 (2006.01)
  H05B 33/14 (2006.01)
  H01L 51/50 (2006.01)
  H01L 51/42 (2006.01)

(52) U.S. Cl.
  CPC ...... *H01L 51/0003* (2013.01); *H01L 51/0007* (2013.01); *H01L 51/0026* (2013.01); *H01L 51/0072* (2013.01); *H01L 51/56* (2013.01); *H05B 33/14* (2013.01); *H05B 33/145* (2013.01); *C09K 2211/10* (2013.01); *C09K 2211/1018* (2013.01); *C09K 2211/188* (2013.01); *H01L 51/4293* (2013.01); *H01L 51/5016* (2013.01); *H01L 2251/5376* (2013.01); *Y02E 10/549* (2013.01); *Y02P 70/521* (2015.11)

(56) References Cited

U.S. PATENT DOCUMENTS

| | | | |
|---|---|---|---|
| 8,480,928 B2 | 7/2013 | Feldmann et al. | 252/301.16 |
| 2006/0029829 A1* | 2/2006 | Thompson | C07D 209/86 428/690 |
| 2012/0119191 A1 | 5/2012 | Dorok et al. | 257/40 |
| 2013/0001472 A1 | 1/2013 | Ohshita et al. | 252/301.16 |
| 2016/0181540 A1 | 6/2016 | Kessler et al. | 257/40 |

FOREIGN PATENT DOCUMENTS

| | | | |
|---|---|---|---|
| DE | 102006023508 A1 | 1/2007 | C09K 11/06 |
| DE | 102008009541 A1 | 8/2009 | A61K 49/00 |
| DE | 102009022858 A1 | 12/2011 | C07F 9/6584 |
| DE | 112011100845 T5 | 1/2013 | C07F 9/94 |
| DE | 102013215342 A1 | 2/2015 | C09K 11/06 |
| JP | 2002110357 A * | 4/2002 | H05B 33/14 |
| JP | 2002110357 A | 4/2002 | C09K 11/06 |
| JP | 2014082235 A | 5/2014 | C07F 15/00 |
| WO | 2005/061654 A1 | 7/2005 | C09K 11/06 |
| WO | 2012/016074 A1 | 2/2012 | B05D 7/24 |
| WO | 2012/153083 A1 | 11/2012 | C09K 11/06 |
| WO | 2015/180901 A1 | 12/2015 | C09K 11/06 |
| WO | 2015/185482 A1 | 12/2015 | C09K 11/06 |

OTHER PUBLICATIONS

Bolton, Onas et al., "Activating Efficient Phosphorescence from Purely Organic Materials by Crystal Design," Nature Chemistry, vol. 3, pp. 205-210, Mar. 2011.

Liu, Zhiwei et al., "A Codeposition Route to CuI-Pyridine Coordination Complexes for Organic Light-Emitting Diodes," Journal of the American Chemical Society, vol. 133, No. 11, pp. 3700-3703, Mar. 2, 2011.

German Office Action, Application No. 102014210676.1, 8 pages, dated Feb. 10, 2015.

International Search Report and Written Opinion, Application No. PCT/EP2015/062085, 20 pages, dated Sep. 1, 2015.

Chinese Office Action, Application No. 201580029821.0, 15 pages, dated Mar. 22, 2018.

Korean Office Action, Application No. 2018064175671, 7 pages, dated Sep. 18, 2018.

European Office Action, Application No. 15728455.5, 4 pages, Oct. 18, 2018.

* cited by examiner

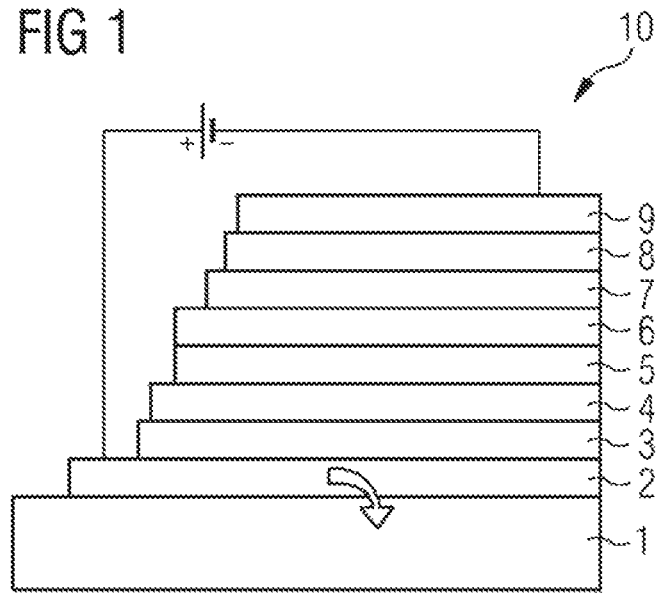
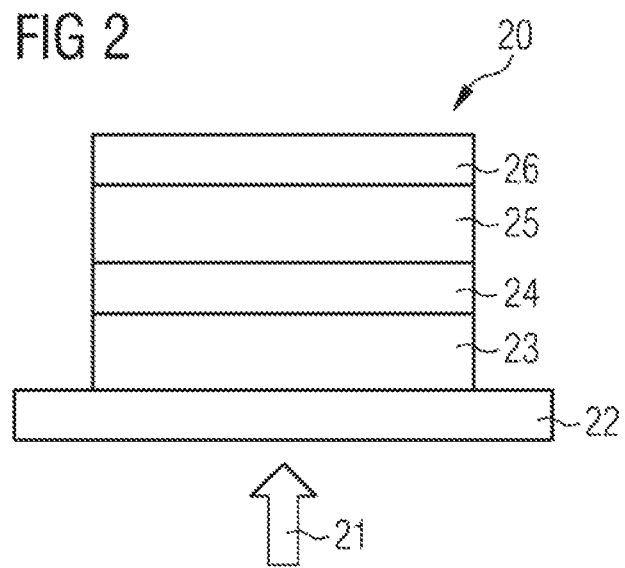

SEQUENTIAL FUNCTIONALIZATION OF PHOSPHORESCENT EMITTER LAYERS

CROSS-REFERENCE TO RELATED APPLICATIONS

This application is a U.S. National Stage Application of International Application No. PCT/EP2015/062085 filed Jun. 1, 2015, which designates the United States of America, and claims priority to DE Application No. 10 2014 210 676.1 filed Jun. 5, 2014, the contents of which are hereby incorporated by reference in their entirety.

TECHNICAL FIELD

The present invention relates to a process for producing phosphorescent emitter layers composed of at least one organic fluorescent emitter and at least one metal complex K comprising organic complex ligands L and at least one heavy main group metal M selected from the group consisting of In, Tl, Sn, Pb, Sb and Bi, wherein the organic fluorescent emitter F and the metal complex K are each deposited individually and layer by layer on a substrate and then reacted with one another, in the course of which the heavy main group metal K changes its coordination sphere to incorporate the organic fluorescent emitter F.

BACKGROUND

Methods in principle for conversion of light to electrical current (and vice versa) by means of organic electronics have been known for a few decades. A method that has made the technical breakthrough, and currently nearing readiness for the mass market, is that of multilayer structures as shown schematically, for example, in FIG. 1 for an organic light-emitting diode (OLED) or in FIG. 2 for an organic solar cell. Even though the efficiency of these components, specifically in the last few years, has experienced a distinct performance boost through the use of optimized classes of organic compounds, promising approaches are still giving rise to even higher quantum yields and hence even higher efficiencies coupled with lower material costs.

One of these approaches lies in the use of phosphorescent emitters, called triplet emitters, which find use, for example, in PHOLEDs (phosphorescent organic light-emitting devices). In view of the applicable quantum statistics, these are at least theoretically capable of achieving an internal quantum efficiency of 100%. This is in contrast with diodes having purely fluorescent emitters which, on the basis of the quantum statistics for the injected charge carriers, have a maximum internal quantum yield of only 25%.

Considering the internal quantum yield alone, organic electronic components which utilize a phosphorescence-based conversion of power to light (and vice versa) (triplet emitters/emission) are if anything suitable for providing a high luminescence (cd/m$^2$) or efficiency (cd/A, lm/W). In the field of compounds capable of triplet emission, however, several boundary conditions have to be noted. Phosphorescence also occurs in compounds of the elements of the fourth and fifth periods of the Periodic Table; however, the complexes of the metals of the 6th period have become established in the abovementioned applications. According to the position of the elements in this period, the origin of phosphorescence is weighted differently within the orbital structure of the complexes.

In the case of the lanthanoids, both the HOMO (highest occupied molecular orbital) and LUMO (lowest unoccupied molecular orbital) are predominantly metal-centered, meaning that the contribution of the ligand orbitals is relatively small. The effect of this is that the emission wavelength (color) of the emitters is determined almost exclusively by the band structure of the metal (examples: europium=red, terbium=green). Because of the significant shielding of the f electrons of these metals, ligands coupled to the metal are capable of splitting the energies of the f$^7$ configuration of the metals only by about 100 cm$^{-1}$, such that the spectroscopy differs considerably from that of the f ions by virtue of their ligand field of the d ions. In the case of ions of the lanthanides, the color results from transitions from f orbitals to unoccupied s, p and d orbitals.

Going along the period to the elements osmium, iridium, platinum and gold, ligand fields split the metal orbitals by a factor 10-100 times more than in the case of lanthanoids. It is thus possible, through variation of the ligands, to produce virtually the entire visible wavelength spectrum with these elements. The strong coupling of the orbital angular momentum of the metal atom to the spin angular momentum of the electrons results in phosphorescence in the emitters. The HOMO here is usually metal-centered, whereas the LUMO is usually ligand-centered. The radiative transitions are therefore referred to as metal-ligand charge transfer transitions (MLCT).

Both OLEDs and OLEECs (organic light-emitting electrochemical cells) are currently using almost exclusively iridium complexes as emitters. In the case of the OLEDs, the emitter complexes are uncharged; in the case of the OLEECs, ionic, i.e. charged, emitter complexes are utilized. However, the use of iridium in these components has a serious drawback. Annual production of iridium is well below 10 t (3 t in 2000). This means that the material costs make a significant contribution to the production costs of organic electrical components. An additional factor is that iridium emitters are incapable of efficiently forming the entire spectrum of visible light. For example, there is a comparative shortage of stable blue iridium emitters, which is a barrier to flexible use of these materials in OLED or OLEEC applications.

In the more recent literature, by contrast, there are some approaches which propose "triplet harvesting" with non-iridium-based emitters as well. For example, Omary et al. in "Enhancement of the Phosphorescence of Organic Luminophores upon interaction with a Mercury Trifunctional Lewis Acid" (Mohammad O. Omary, Refaie M. Kassab, Mason R. Haneline, O. Elbjeirami, and Francois P. Gabbai, Inorg. Chem. 2003, 42, 2176-2178) refer to the possibility of attaining adequate phosphorescence of purely organic emitters through the use of mercury. As a result of the heavy atom effect of mercury in a matrix composed of organic ligands, a singlet-triplet/triplet-singlet transition of the excited electrons of the organic matrix is enabled in quantum-mechanical terms (ISC, intersystem crossing), which results in a distinct reduction in the lifetime of the excited electronic (triplet) states and avoids unwanted saturation of the population of these states. The cause of this mechanism is the spin-orbit coupling of the heavy mercury atom to the excited electrons of the organic matrix. A disadvantage, by contrast, is that the use of mercury is problematic for reasons relating to toxicity and environmental policy.

One way of obtaining an adequate quantum yield based on purely organic phosphorescent emitters is described, for example, by Bolton et al. in NATURE CHEMISTRY 2011, 1-6 ("Activating efficient phosphorescence from purely organic materials by crystal design", Onas Bolton, Kangwon Lee, Hyong-Jun Kim, Kevin Y. Lin and Jinsang Kim.

NATURE CHEMISTRY, 2011, 1-6). The idea presented here is that the incorporation of heavy halides into a crystal composed of an organic matrix leads to high quantum yields by virtue of phosphorescent organic emitters. A disadvantage of this solution, by contrast, is that this effect seems to require a certain distance between the heavy halides and the organic matrix and a crystalline structure. This would be a barrier to inexpensive industrial manufacture of organic components.

WO 2012/016074 A1, by contrast, describes a thin layer comprising a compound of the formula

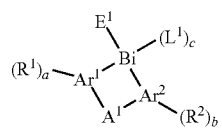

where $Ar^1$ and $Ar^2$ are each independently a C3-30 aromatic ring; $R^1$ and $R^2$ are a substituent; a and b are each independently an integer from 0 to 12, where, when a is 2 or more, each R1 radical may be different than the others, and two $R^1$ radicals may be joined to one another in order to form a ring structure, and, when b is 2 or more, each $R^2$ radical may be different from the others and two $R^2$ radicals may be joined to one another, in order to form a ring structure; $A^1$ is some kind of direct bond, —O—, —S—, —S(=O)—, —S(=O)$_2$—, —PR$^3$—, —NR$^4$— and —C(R$^5$)$_2$—; $R^3$ is a hydrogen atom or a substituent; $R^4$ is a hydrogen atom or a substituent; $R^5$ is a hydrogen atom or a substituent and two $R^5$ radicals may be different from one another; $E^1$ is a monovalent radical having 50 or fewer carbon atoms; $L^1$ is a ligand having 50 or fewer carbon atoms; c is an integer from 0 to 3, where, when c is 2 or more, each $L^1$ radical may be different from the others; and any combination of a combination of $E^1$ and $Ar^1$ and a combination of $E^1$ and $Ar^2$ may form a bond; and, when c is 1 to 3, any combination of a combination of $L^1$ and $E^1$, a combination of $L^1$ and $Ar^1$, a combination of $L^1$ and $Ar^2$ and a combination of $L^1$ and $L^1$ may form a bond. A disadvantage, by contrast, is that the compounds described have only an inadequate quantum yield and do not have sufficient stability in solution, such that they break down.

DE 103 60 681 A1 discloses main group metal diketonato complexes of the following formula:

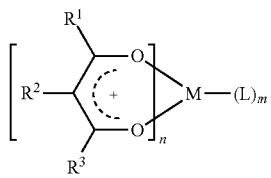

as phosphorescent emitter molecules in organic light-emitting diodes (OLEDs), in which M may be Tl(I), Pb(II) and Bi(III). Additionally disclosed are the use of these main group metal diketonato complexes as light-emitting layers in OLEDs, light-emitting layers comprising at least one main group metal diketonato complex, an OLED comprising this light-emitting layer, and devices containing an OLED of the invention. In experiments, by contrast, it was shown that the abovementioned compounds, synthesized with strict exclusion of water, do not exhibit any phosphorescence-based emission after electronic excitation. It is very likely that the phosphorescent emission cited originates from oxo clusters that cannot be determined specifically, which have formed in an uncontrolled manner, for example as a result of hydrolysis in the course of preparation. A disadvantage of this specific solution is that the π system of these acetylacetonate ligands, especially of the fully fluorinated variants described, is not well-developed and, being the sole phosphorescence emitter, permits only low phosphorescence yields.

If stated at all in the documents cited above, the phosphorescence emitters are prepared by standard methods, for example deposition/reaction or crystallization from solution or coevaporation. No more specific methods for production of particularly effective layers including particularly advantageous phosphorescence emitter complexes are disclosed.

SUMMARY

One embodiment provides a process for producing phosphorescent emitter layers composed of at least one organic fluorescent emitter F and at least one metal complex K comprising organic complex ligands L and at least one heavy main group metal M selected from the group consisting of In, Tl, Sn, Pb, Sb and Bi, wherein the organic fluorescent emitter F and the metal complex K are each deposited individually and layer by layer on a substrate and then reacted with one another, in the course of which the heavy main group metal M changes its coordination sphere to incorporate the organic fluorescent emitter F.

In one embodiment, the reacting is effected by heating at a temperature of not less than 50° C. and not more than 300° C.

In one embodiment, the layer thickness ratio between the organic fluorescent emitter layer and metal complex layer prior to the reaction is not less than 0.1 and not more than 15.

In one embodiment, the heavy main group metal is Bi.

In one embodiment, the applying of the individual layers is effected repeatedly prior to the reacting and the number of individually deposited layers is not less than 3 and not more than 100.

In one embodiment, at least one lower layer is deposited via an evaporation process and at least one upper layer via a solvent process.

In one embodiment, the organic complex ligands L of the metal complex M are independently selected from the group consisting of halides and fluorinated or non-fluorinated C1-C30 alkyl or aryl carboxylates, alkoxides, thiolates, cyanates, isocyanates, thiocyanates, acetylacetonates, sulfonates.

In one embodiment, the organic complex ligands L of the metal complex M are independently selected from the group consisting of fluorinated or non-fluorinated aliphatic C1-C30 carboxylates.

In one embodiment, the metal complex K comprises at least two different organic complex ligands L.

In one embodiment, the metal complex K comprises one or more compounds from the group of Bi(III) triacetate, Bi(III) trifluoroacetate, Bi(III) tris-3,5-difluorobenzoate, Bi(III) tris-3,4,5-trifluorobenzoate, Bi(III) tris-2,3,5,6-tetrafluorobenzoate, Bi(III) tris-2,3,4,5,6-pentafluoro-benzoate, Bi(III) tris-2,3,5,6-tetrafluoro-4-trifluoro-methylbenzoate, Bi(III) tris-3,5-trifluoromethylbenzoate, Bi(III) pentafluorobenzoate and Bi(III) 3,5-trifluoro-methylbenzoate.

In one embodiment, the metal complex K is a dinuclear metal complex.

In one embodiment, the organic fluorescent emitters F are selected from the group of the substituted or unsubstituted C6-C60 N-heteroaromatics.

In one embodiment, the organic fluorescent emitters F are selected from the group consisting of 4,5-di(9H-carbazol-9-yl)-1,10-phenanthroline, 2,6-bis(3-(9H-carbazol-9-yl)phenyl)pyridine and 3,5-bis(3-(9H-carbazol-9-yl)phenyl)pyridine.

Another embodiment provides an organic electrical component comprising at least one phosphorescent emitter layer produced by a process disclosed above.

Another embodiment provides the use of such component as an organic solar cell, an organic transistor, a light-emitting organic component, an organic light-emitting diode, and/or an organic light-emitting electrochemical cell.

BRIEF DESCRIPTION OF THE DRAWINGS

Example aspects and embodiments are described in detail below with reference to the figures, in which:

FIG. 1 shows a schematic of the construction of an example organic light-emitting diode, according to one embodiment; and FIG. 2 shows a schematic of an example construction of an organic solar cell having PIN structure, according to one embodiment.

DETAILED DESCRIPTION

Embodiments of the present invention provide an improved process for producing phosphorescent emitter layers, which can be implemented inexpensively and leads to efficient and long-lived emitter layers.

Some embodiments provide a process for producing phosphorescent emitter layers composed of at least one organic fluorescent emitter F and at least one metal complex K comprising organic complex ligands L and at least one heavy main group metal M selected from the group consisting of In, Tl, Sn, Pb, Sb and Bi, wherein the organic fluorescent emitter F and the metal complex K are each deposited individually and layer by layer on a substrate and then reacted with one another, in the course of which the heavy main group metal M changes its coordination sphere to incorporate the organic fluorescent emitter F. It has been found that, by means of this process, it is possible in a simple and inexpensive manner to obtain layers comprising organic emitters that are phosphorescent at room temperature, and which have a high internal quantum efficiency, high luminances, rapid response characteristics and good long-term stabilities. Without being bound by theory, the phosphorescence of the actually fluorescent organic emitters is induced by addition directly into and onto the coordination sphere of the heavy main group metal. Because of the structure of the complex obtainable, it is additionally possible, through modification of the ligands of the complex, especially the f system thereof, to tune the emission wavelength of the emitters. It is especially possible to form heteroleptic complexes or addition compounds which enable emissions via the orbitals of differently constructed ligands/emitters. This additionally increases the variety for preparation of purely organic phosphorescent emitters. Without being bound by theory, the sequential, i.e. layer by layer, deposition first of one component and the subsequent deposition of the 2nd component, via the subsequent reaction step, can give rise to particular layer structures not obtainable by codeposition of the two components. Thus, the sequential deposition process with subsequent reaction can give, with high probability, nonstoichiometric emitter-metal complexes in which the fluorescent emitter F is not just incorporated as a ligand into the direct coordination sphere of the main group metal; instead, fluorescent emitters F are additionally also present at further, thermodynamically preferred addition sites around the metal complex. At the same time, the emitters F not incorporated into the next coordination sphere of the metal complex nevertheless seem to be in a position to be capable of phosphorescence by virtue of the heavy metal atom effect of the metal. Because of the fact that the emitters F incorporated are to some degree not incorporated into the direct coordination sphere of the metal atom, it is additionally possible for these to interact with several metal atoms from the near environment. There is accordingly a situation in which, after the reaction, emitters F having different physical bonding are present: firstly the emitters F in the direct coordination sphere of the heavy metal atom and secondly emitters F that are not bound directly to the heavy metal atom but occupy further-removed positions outside the direct coordination sphere of the metal atom. By virtue of this different distance (binding/coordination) of the fluorescent emitters F to the metal atom, it is possible to obtain different phosphorescence properties of the organic electrical layer. The additional emitters arranged between the metal complexes additionally allow the emission and absorption characteristics of the layer to be influenced. More particularly, the sequential deposition first of one and then of the other component with a subsequent reaction step seems to lead to homogeneous layers with defined "inter-complex positions" of the additional emitters. Without being bound to theory, this is very probably attributable to the diffusion process which leads firstly to incorporation of the fluorescent emitters into the direct coordination sphere of the heavy metal atom and secondly to population of thermodynamically favorable sites adjacent to the heavy metal atom complexes. This structure of organic layers is not obtainable by other methods, particularly by simultaneous deposition of the two components, either for thermodynamic or kinetic reasons. The incorporation of the organic emitters at the different positions can be analytically detected by methods known to those skilled in the art. This is done, for example, by IR or NMR spectroscopy or by measuring the phosphorescence properties of the layers after the reaction.

The change in the direct coordination sphere of the metal may consist of an increase in the number of coordinated ligands/emitters, a substitution of one or more ligands for emitters, or even in a reduction in the number of coordinated ligands by virtue of the adduct/complex formation with the emitter.

This is a function of the steric and electronic properties of the emitters and ligands, the strength of coordination of the individual ligands and the chosen reaction conditions in the subsequent reacting. In the case of adduct formation or coordination of the emitter to the heavy main group metal atom, there is no need for a σ bond to be formed between the heavy atom and the organic emitters. Weak electrostatic and/or Π interactions between the metal and emitter are sufficient. However, the interaction with the heavy metal atom can also alter the energy position of the HOMO/LUMO of the fluorescent emitter(s). As a result of the heavy atom effect, there may additionally be spin-orbit coupling between the emitter electrons and the metal atom nucleus, the effect of which is that electronic transitions that have been spin-forbidden to date are allowed in quantum-mechanical terms. This results in a drop in the lifetime of the electronically excited states and hence an effective phosphorescence channel (with triplet-singlet transitions) is opened up at room temperature. The metal is not directly involved in the emission; it merely provides its orbital angular momentum. This contrasts with the emission of the organic emitters without heavy metal coordination, which is purely fluorescent at room temperature.

The emitter layers obtained in accordance with the invention may be neutral or ionic by nature and thus exhibit OLED- or OLEC-typical emission characteristics.

An organic electrical layer in the context of the invention is understood to mean a layer comprising organic emitters, metal complexes containing heavy main group metals and optionally matrix materials. The layer may also be amorphous, meaning that the individual constituents in this layer do not have periodic arrangement over any great range (long-range order). More particularly, this is not understood to mean the presence of a single crystal or of crystalline regions having a size of not less than 50 nm. The compounds present in the layer may, though, have a certain short-range order (distance and orientation) with respect to their closest neighbors. These regions, however, are randomly distributed. Within an x-ray diffractogram, for example obtained by an XRD measurement (x-ray powder diffractometry), the amorphous layer features a broad halo. It has been found that, surprisingly, an amorphous arrangement of the regions in the layer is sufficient to obtain an adequate phosphorescence yield. This contrasts with experimental results which require a very regular arrangement of a multitude of metal atoms and emitters as a condition for obtaining high phosphorescence yields.

As a result of the influence of the heavy metal, a significant phosphorescence contribution of the organic fluorescent emitter is obtained at room temperature. Room temperature in the context of the invention is the temperature range from −50° C. to 150° C. (the customary working temperature range for organic electronics). Within this temperature range, the phosphorescent transitions of one or more fluorescent emitters with no heavy metal atom effect generally do not provide any significant contributions to the emission of purely organic emitters.

Organic fluorescent emitters F are organic molecules which, either in part or in full, can have aromatic character with delocalized Π electrons. In addition, these molecules may have heteroatoms such as N, N—R, O, S, Se, Si or metals such as Li or Al, Ga or Zn. R in this case is an alkyl or aromatic radical. These molecules, in solid form or in solution, exhibit fluorescence after electronic excitation, i.e. electronic (S1-S0) singlet-singlet transitions. Phosphorescent transitions (T-S) cannot be observed at room temperature because of the quantum-mechanical exclusion rules (reversal of spin). The lifetime of the fluorescent transitions in the organic fluorescent emitters usable in accordance with the invention, without convergence with the heavy metal atom, may be within a range below 100 ns.

Preferably, the organic fluorescent emitters F may be C10-C60 heteroaromatics, and additionally preferably C15-C50 heteroaromatics. In specific applications, the oxygen- and nitrogen-containing heteroaromatics have been found to be particularly favorable. In addition, organic fluorescent emitters used with preference within the process of the invention may be those whose triplet state is not less than −5 eV and not more than 5 eV away from the S0 state. With these electronic boundary conditions, it is possible to obtain particularly high quantum yields within the process of the invention.

Within the process of the invention, metal complexes containing heavy main group metals M from the group consisting of In, Tl, Sn, Pb, Sb and Bi are used. These metal complexes may include organic complex ligands and are preferred particularly because of their availability, their purchase cost and their ability to develop marked spin-orbit coupling and the possibility of extending the coordination sphere. It is also possible for two or more different metals from the abovementioned group to be present in the metal complex usable in accordance with the invention. This group is particularly suitable since the elements listed therein have a particularly high orbital angular momentum which enables effective phosphorescence transitions in the organic emitters F. Moreover, these metals are available in high purity at relatively low cost.

In a particular execution variant, the group may advantageously also include Sn, Pb and Bi. These metals additionally have the benefit that they can also be processed very efficiently from solutions.

Preferably, the metals can be coordinated with organic ligands bridged in a terminal, bidentate, tridentate or heterobimetallic manner with the metal atom. Advantageous configurations can arise when ligands are coordinated to the metal atom via two oxygen atoms. Without being bound by theory, these substituents, in the course of the deposition process, can be efficiently displaced by the organic emitters or the coordination sphere can be broadened, thus contributing to a high phosphorescence yield. In addition, by means of these substituents, the emission wavelength of the phosphorescence light can be tuned via ligand-ligand transitions. Preferably, ligands coordinated in this way may have aromatic Π systems having at least 10 carbon atoms. This can lead to significant broadening of the emission wavelengths in ligand-ligand transitions.

The heavy main group metal M changes its coordination sphere to incorporate the organic fluorescent emitter F. Without being bound by theory, in the process of the invention, the organic emitters are brought close to the main group metal. A subgroup of the ligands is then incorporated directly into the coordination sphere of the heavy metal atom. There is then a change in the arrangement of the ligands of the metal complex. This is caused by van der Waals, coulombic, Π-σ or σ interactions of the organic emitter with the metal. A σ interaction is not needed for development of phosphorescence, but may also be formed. The coordination sphere of the metal can be broadened by the proximity of the organic emitter. There may also be substitution of a single ligand or two or more ligands by the organic emitter. In addition, it is also possible that the number of ligands is reduced by the change in the coordination sphere. This results, for example, from the displacement of one or more ligands by the incorporation of the fluorescent organic emitter. The remaining amount of organic fluorescent emitter is not bound directly to the metal atom of the complex but populates thermodynamically favorable sites between the metal complexes. Even though the organic fluorescent emitters F are not arranged directly in the 1st coordination sphere of the metal, the spatial proximity at the intermediate complex sites is sufficient to open up the phosphorescence channels of the fluorescent emitter by virtue of the heavy metal atom effect of the main group metal. As a result, 2 different emitter species are obtained, which differ in terms of their phosphorescence properties. The reason for this may also, in particular, be that the emitter not incorporated directly into the coordination sphere of the metal atom is simultaneously affected by a plurality of heavy metal atoms.

The "reacting" of the organic fluorescent emitters F and the metal complexes may thus include different stages: firstly a 1st stage in which the substances present in different layers are brought into immediate spatial proximity by a diffusion process, a 2nd stage in which the coordination sphere of the metal atom changes through incorporation of the organic emitter. In a 3rd stage, it is then possible for further organic emitters F to occupy thermodynamically favorable sites between the metal complexes and, at these sites, also to be capable of phosphorescence through interactions with two or more metal complexes. This gives rise to complexes having a non-stoichiometric (i.e. odd) number of emitters per metal complex.

The organic fluorescent emitters F and the metal complexes are especially deposited individually and layer by layer when they are not applied simultaneously, for example dissolved in the same solvent, applied simultaneously dissolved in different solvents, applied by vapor deposition simultaneously to a substrate from different sources, or applied by vapor deposition simultaneously to a substrate from one source. What is envisaged in accordance with the invention is first the application of one component on the substrate, this component being free of the 2nd component, and then the application of the 2nd component, the 2nd component being free of the 1st component. Appropriately, the components can be applied homogeneously to the substrate, so as to give layers of uniform thickness. However, it is also possible to conceive of configurations whereby the layers are applied only partially to subregions of the substrate or with different thickness. This only partial application also leads to layers in the context of the invention. The individual application of layers in the context of solvent processing can be effected, for example, by first applying a 1st layer of a 1st component, then removing the solvent, and then applying a 2nd layer with (or without) a solvent. The reacting in this case can be effected simultaneously or sequentially with the evaporation of the latter solvent.

In addition to the metal complex and to the organic emitter, it is possible within the scope of the process of the invention to deposit still further non-coordinating matrix materials within the layers. This/these matrix material(s) can, for example, affect the electronic conductivity of the layer or generally affect the mobility of the organic emitter or the metal complex. Suitable matrix materials may be selected from the group of 2,2',7,7'-tetrakis(carbazol-9-yl)-9,9-spirobifluorene; 2,7-bis(carbazol-9-yl)-9,9-ditolylfluorene; 9,9-bis[4-(carbazol-9-yl)phenyl]-fluorene; 2,7-bis(carbazol-9-yl)-9,9-spirobifluorene; 1,4-bis-(triphenylsilyl) benzene; 1,3-bis(triphenylsilyl)benzene; bis(4-N,N-diethylamino-2-methylphenyl)-4-methylphenylmethane; 2,7-bis(carbazol-9-yl)-9,9-dioctylfluorene; 4,4''-di(triphenyl-silyl)-p-terphenyl; 4,4'-di(triphenylsilyl)biphenyl; 9-(4-tert-butylphenyl)-3,6-bis(triphenylsilyl)-9H-carbazole; 9-(4-tert-butylphenyl)-3,6-ditrityl-9H-carbazole; 9-(4-tert-butylphenyl)-3,6-bis(9-(4-methoxyphenyl)-9H-fluoren-9-yl)-9H-carbazole; 2,6-bis(3-(9H-carbazol-9-yl)phenyl)pyridine; 3,5-bis(3-(9H-carbazol-9-yl)phenyl)pyridine, triphenyl(4-(9-phenyl-9H-fluoren-9-yl)phenyl)silane; 9,9-dimethyl-N,N-diphenyl-7-(4-(1-phenyl-1H-benzo[d]imidazol-2-yl)phenyl)-9H-fluoren-2-amine; 3,5-bis(3-(9H-carbazol-9-yl)phenyl)pyridine; 9,9-spiro-bifluoren-2-yldiphenylphosphine oxide; 9,9'-(5-(triphenyl-silyl)-1,3-phenylene)bis(9H-carbazole); 4,4,8,8,12,12-hexa-p-tolyl-4H-8H-12H-12C-azadibenzo[cd,mn]pyrene; 2,2'-bis(4-(carbazol-9-yl)phenyl)biphenyl; 2,8-bis(diphenylphosphoryl)-dibenzo[b,d]thiophene; bis(2-methylphenyl)diphenylsilane; bis[3,5-di(9H-carbazol-9-yl)phenyl]diphenylsilane; 3,6-bis (carbazol-9-yl)-9-(2-ethylhexyl)-9H-carbazole; 3-(diphenylphosphoryl)-9-(4-(diphenylphosphoryl)phenyl)-9H-carbazole; 3,6-bis[(3,5-diphenyl)phenyl]-9-phenylcarbazole; 2,8-di(9H-carbazol-9-yl)dibenzo[b,d]thiophene; 10-(4'-(diphenylamino)-biphenyl-4-yl)acridin-9(10H)-one; 2,7-bis(diphenylphosphoryl)-9,9'-spirobi[fluorene]; 1,4-bis((9H-carbazol-9-yl)methyl)-benzene; bis-4-(N-carbazolyl) phenyl)phenylphosphine oxide; 2,7-bis(diphenylphosphoryl)-9-(4-diphenylamino)phenyl-9'-phenyl-fluorene; di(4-(6H-indolo[3,2-b]quinoxalin-6-yl) phenyl)-diphenylsilane; di(4-(6H-indolo[3,2-b]quinoxalin-6-yl)phenyl)diphenylmethane; bis[3,5-di(9H-carbazol-9-yl) phenyl]-diphenylsilane; 2,6,14-tris(carbazol-9-yl) triptycene; 2,6,14-tris(diphenylphosphine oxide)triptycene; 2,6,14-tris(diphenyl-amino)triptycene; 2,7-bis(diphenyl-phosphoryl)-9-phenyl-9H-carbazole; tris[4-(9-phenylfluoren-9-yl)phenyl]aminobiphenyl-3-amine); 2,7-bis(diphenyl-phosphoryl)spiro[fluorene-7,11'-benzofluorene].

The present invention is described in detail hereinafter in conjunction with further aspects and embodiments. They can be combined with one another as desired, unless the opposite is clearly apparent from the context.

In a preferred embodiment of the process, the reacting can be effected by heating at a temperature of not less than 50° C. and not more than 300° C. This temperature range has been found to be particularly suitable for production of homogeneous and efficient phosphorescent emitter layers. Firstly, this temperature range achieves efficient diffusion of the organic emitters F and the metal complexes, and this temperature range secondly enables efficient reacting of the individual emitter species, with reliable incorporation of the fluorescent emitters F into the metal complexes. In some cases, these temperatures are above the melting point or the softening point of a component. Lower temperatures are not in accordance with the invention, since only an incomplete diffusion process is to be expected. Furthermore, the processing times would be unnecessarily prolonged. An additional factor is also that the establishment of thermodynamically favorable positions outside the metal complexes cannot be achieved with sufficient speed. Higher temperatures are not in accordance with the invention, since this can lead to unwanted side reactions within the layer. The heating can be effected by the methods familiar to those skilled in the art, for example by convection or radiant heat (e.g. IR or microwave radiation). The duration of the reacting can be chosen freely as a function of the layer thicknesses and the compounds used, and may appropriately be within a range between not less than 1 second and not more than 12 hours, preferably not less than 60 seconds and not more than 1 hour.

In a further characteristic of the process, the layer thickness ratio between organic fluorescent emitter layer and metal complex layer prior to the reaction may be not less than 0.1 and not more than 15. The application of the individual layers advantageously also allows the concentration ratios of organic emitter and metal complex to be controlled via the layer thickness ratios of the individual layers. For example, in the context of vacuum processing, a constant deposition rate of the two sources can be chosen and the molar ratio of the two species in the resulting homogeneous layer can be adjusted over the thickness of the individual layers. The above-specified layer thickness ratios arise from the quotient of the layer thicknesses of emitter layer a metal complex layer. In the case of solvent processing, the layer thicknesses of the solvent-free layers are considered. The layer thickness of a layer can arise from mathematical considerations, for example from the vapor deposition rate or the concentration of the species in the solvent, or be obtained by means of an x-ray structure analysis after application of the layers. Any great differences in the layer thickness ratio are inappropriate, since this can lead to longer diffusion pathways, which can be a barrier to efficient production.

In an additional configuration of the process, the layer thickness of a single lamina prior to the reaction may be not less than 0.01 nm and not more than 100 nm. This specified range of absolute layer thicknesses has been found to be particularly suitable in the context of vacuum or wet processes. Within this range, it is possible in the context of the reacting, to produce a homogeneous layer within reasonable processing times, in which the individual constituents are distributed homogeneously. This is very probably caused by the diffusion coefficients of the chosen substances within the temperature range specified. Any greater layer thicknesses, by contrast, can be disadvantageous, since this would extend the processing times. Furthermore, in the case of greater layer thicknesses, the formation of local gradients or the incorporation of organic emitters F at sites that are not thermodynamically preferred cannot be ruled out. Gradients of this kind may be desirable to establish particular color loci.

In a further preferred embodiment, the heavy main group metal may be Bi. Bismuth has been found to be particularly suitable because of its economic and process-related properties. There exist a multitude of complexes which can be processed particularly efficiently with organic fluorescence emitters within the scope of wet or gas phase processes. Even though bismuth directly follows lead in the Periodic Table, it has quite different physiological properties. Because it can only be absorbed with difficulty via the gastrointestinal tract, bismuth poisoning is comparatively rare. By contrast, salts of bismuth are used in medicine for treatment of stomach ulcers or syphilis. It has also been used as a contrast agent for x-ray examinations. The only naturally occurring isotope of bismuth is that with mass 209. It is a radioactive a emitter with a half-life of $1.9 \times 10^{19}$ years. For 1 kg, the long half-life results in activity of 0.0033 Bq. This is therefore about 10 million times less than potassium, which occurs in organisms. One kilogram of potassium naturally contains 0.012%, i.e. 0.12 gram, of the radioactive isotope $^{40}$K with a half-life $t_{1/2}$ of $1.248 \times 10^9$ years=$39.38 \times 10^{15}$ seconds, and has an atomic mass of 39.96. This gives a radioactivity of 31 825 Bq. Thus, the radioactivity of bismuth is negligibly small for practical applications and would not even be detectable by a human holding a Geiger counter. Bismuth, by contrast with iridium (3/2) and europium (5/2), has a nuclear spin of (9/2). It is capable of coupling to unpaired electrons present in ligands (see also "Synthesen und Eigenschaften neuer Tris(fluorphenyl)antimon-und-bismut-Verbindungen. Kristallstruktur von Tkis(2, 6-difluorphenyl)bismut" by T. Lewe et al. Z. anorg. allg. Chem. 622 (1996) 2009-2015). These properties and the fact that bismuth, compared to iridium deposits, is subject to virtually no restriction can lead to a dramatically better reactant cost situation.

In a further aspect of the process, the applying of the individual layers is effected repeatedly prior to the reacting and the number of individually deposited layers is not less than 3 and not more than 100. In the context of the process presented, it is additionally possible to produce greater layer thicknesses without having to accept long diffusion pathways of the individual species. This is effected by more frequent sequential deposition, and executing the reaction of all the layers only after the repeated application. In this way, it is possible to produce layer stacks wherein the diffusion pathway of the individual species is minimized. The total layer thickness of the layer obtainable after the reaction may be not less than 1 nm and not more than 100 nm, more preferably not less than 3 nm and not more than 75 nm, and further preferably not less than 5 nm and not more than 30 nm.

In an additional aspect of the process of the invention, the proportion of organic emitters F not coupled directly to the metal complex but present between the individual metal complexes is not less than 0.1% and not more than 50%, preferably not less than 1% and not more than 25%, further preferably not less than 5% and not more than 20%.

The percentage is calculated as the quotient of organic emitters F between the metal complexes and emitters F coordinated directly to a metal atom. One way of determining the individual proportions is, for example, to dissolve the layer in a suitable solvent and analyze it by mass spectroscopy.

In a further, preferred embodiment of the process, at least one lower layer can be deposited via an evaporation process and at least one upper layer via a solvent process. By virtue of this processing option, it is possible to combine the advantages of wet processing and of vacuum processing with one another. For example, it is not possible to process or evaporate all organic emitters or all metal complexes equally well from solution. Within this process, it is therefore possible to use the component which can be better processed from solution in a solvent processing operation and to deposit that component which can be evaporated efficiently in a vacuum processing operation. The sequence of processing can of course also be reversed. For example, it is also possible to deposit a 1st layer via a solvent process and the 2nd layer via a vacuum processing operation. In that case, the application of the 2nd layer is appropriately effected only after evaporation of the solvent in an intermediate step.

In an additional aspect of the process, the organic complex ligands L of the metal complex M may independently be selected from the group consisting of halides and fluorinated or non-fluorinated C1-C30 alkyl or aryl carboxylates, alkoxides, thiolates, cyanates, isocyanates, thiocyanates, acetylacetonates, sulfonates. These ligands in the metal complex can lead to easy processibility in wet and gas phase processing and, because of their coordination properties to the metal atom, can contribute to simple alteration of the coordination sphere of the metal atom.

Within the metal complex, it is possible for just one or else more than one of the abovementioned ligands to be present. Preferably, the complex may have mixed ligands. This occurs either through extension of the coordination sphere of the metal or through replacement of an individual ligand or two or more ligands. These ligands may additionally be utilized to adjust the emission wavelength of the organic emitter. This can be caused by electronic interactions of the ligand(s) with the emitter. These ligand L in the metal complex may preferably make up a proportion of not less than 0% and not more than 20% of the overall emissions yield of the layer. This range may preferably be between not less than 0% and not more than 10% and further preferably between not less than 0% and not more than 5%.

In addition, in a further aspect of the process, the ligands L of the metal complex may independently be selected from the group consisting of C6-C30 aromatics and heteroaromatics. These aromatics or heteroaromatics may contribute to easy processibility in wet and gas phase processing, and additionally enable the organic emitters to easily coordinate to the metal atom and to be incorporated into the thermodynamically favorable inter-complex positions. The interactions of the H electrons can additionally affect the position of the phosphorescence wavelengths of the organic emitter and hence contribute to an altered emission spectrum of the emitter and hence also of the layer.

In a further preferred embodiment, the metal complex may contain a Bi(III) and at least one complex ligand from the group of the unsubstituted, partly fluorinated or perfluorinated organic carboxylic acids. The metal complex may preferably contain one, two or three of these organic carboxylic acids. Organic carboxylic acids may generally be selected from the group of the aliphatic saturated monocarboxylic acids; aliphatic unsaturated monocarboxylic acids; aliphatic saturated dicarboxylic acids; aliphatic saturated tricarboxylic acids; aliphatic unsaturated dicarboxylic acids; aromatic carboxylic acids, heterocyclic carboxylic acids; aliphatic unsaturated cyclic monocarboxylic acids. Particularly preferred partial or perfluorinated ligands L may be selected from substituted or unsubstituted compounds of acetic acid, phenylacetic acid and/or benzoic acid. More preferably, it is possible to use nonfluorinated, partly fluorinated or perfluorinated acetic acid. In a further preferred embodiment, it is possible for one or more polydentate ligands L, in the unevaporated state, to be arranged in a bridging position between the metal atoms of the complex. These compounds can be processed in a simple manner either from the wet phase or via a gas phase deposition process, and enable good binding of the fluorescent emitter within the layer. As such, they can lead to long-lived emitter components having a very good quantum yield.

In a further configuration of the process, the organic complex ligands L of the metal complex M may independently be selected from the group consisting of fluorinated or nonfluorinated aliphatic C1-C30 carboxylates. Specifically the coordination of the ligands via two oxygen atoms to the heavy main group metal can enable a facilitated alteration of the coordination sphere through the entry of the organic fluorescent emitter. By virtue of this configuration, it is possible to obtain particularly stable and efficient layers having long lifetimes. Moreover, the steric properties of the aliphatic carboxylates seem to be particularly suitable for making it possible for the further organic emitters not incorporated directly into the coordination sphere of the metal atom still to be able to assume a sufficiently small distance from the metal atoms, which enables effective opening of the phosphorescence channel. Accordingly, an effective contribution is also obtained via the organic emitters that are not bonded directly. Preferably, the complex ligands L may also be fluorinated or nonfluorinated aliphatic C1-C20 carboxylates and additionally preferably fluorinated or nonfluorinated linear aliphatic C1-C20 carboxylates.

In addition, in an additional aspect of the process, the metal complex K may comprise at least two different organic complex ligands L. For the formation of effective organic emitters capable of phosphorescence, it has been found to be suitable for the metal complex K to comprise at least 2 different organic ligands. Without being bound by theory, this may be advantageous because one kind of ligand can be replaced particularly readily by a fluorescent emitter and the other kind of ligand enables effective interaction of an organic emitter F not bonded directly to the metal complex. This is the result, for example, of particular steric prerequisites or a particular electronic structure of the ligand. In this way, the positions of the organic emitters not bonded directly can be effected, and hence the emissive and absorptive properties of the resulting layer can be adapted.

In a further characteristic of the process, the metal complex K may comprise one or more compounds from the group of Bi(III) triacetate, Bi(III) trifluoroacetate, Bi(III) tris-3,5-difluorobenzoate, Bi(III) tris-3,4,5-trifluorobenzoate, Bi(III) tris-2,3,5,6-tetrafluorobenzoate, Bi(III) tris-2,3,4,5,6-pentafluorobenzoate, Bi(III) tris-2,3,5,6-tetrafluoro-4-trifluoromethylbenzoate, Bi(III) tris-3,5-trifluoromethylbenzoate, Bi(III) pentafluorobenzoate and Bi(III) 3,5-trifluoromethylbenzoate. Specifically the coordination of the ligands via two oxygen atoms to the heavy main group metal can enable facilitated alteration of the coordination sphere through the entry of the organic fluorescence emitter. By virtue of this configuration, it is possible to produce particularly stable and efficient layers with long lifetimes. In addition, the abovementioned ligands additionally enable more effective interaction of the organic emitters not bonded directly with the heavy metal atoms.

In an additional aspect of the invention, the metal complex may comprise at least one substituent selected from the group of:

fluorinated benzoates,
for example 2-(trifluoromethyl)benzoate; 3,5-difluorobenzoate; 3-hydroxy-2,4,6-triiodobenzoate; 3-fluoro-4-methylbenzoate; 3-(trifluoromethoxy)benzoate; 4-(trifluoromethoxy)benzoate; 4-chloro-2,5-difluorobenzoate; 2-chloro-4,5-difluorobenzoate; 2,4,5-trifluorobenzoate; 2-fluorobenzoate; 4-fluorobenzoate; 2,3,4-trifluorobenzoate; 2,3,5-trifluorobenzoate; 2,3-difluorobenzoate; 2,4-bis(trifluoromethyl)benzoate; 2,4-difluorobenzoate; 2,5-difluorobenzoate; 2,6-bis(trifluoromethyl)benzoate; 2,6-difluorobenzoate; 2-chloro-6-fluorobenzoate; 2-fluoro-4-(trifluoromethyl)benzoate; 2-fluoro-5-(trifluoromethyl)-benzoate; 2-fluoro-6-(trifluoromethyl)benzoate; 3,4,5-trifluorobenzoate; 3,4-difluorobenzoate; 3,5-bis-(trifluoromethyl)benzoate; 3-(trifluoromethyl)benzoate; 3-chloro-4-fluorobenzoate; 3-fluoro-5-(trifluoromethyl)-benzoate; 3-fluorobenzoate; 4-fluoro-2-(trifluoromethyl)-benzoate; 4-fluoro-3-(trifluoromethyl)benzoate; 5-fluoro-2-methylbenzoate; 2-(trifluoromethoxy)benzoate; 2,3,5-trichlorobenzoate; 4-(trifluoromethyl)benzoate; pentafluorobenzoate; 2,3,4,5-tetrafluorobenzoate; 2,3,5,6-tetrafluoro-4-(trifluoromethyl)benzoate;

fluorinated or nonfluorinated phenylacetates,
for example 2-fluorophenylacetate; 3-fluorophenylacetate; 4-fluorophenylacetate; 2,3-difluorophenylacetate; 2,4-difluorophenylacetate; 2,6-difluorophenylacetate; 3,4-difluorophenylacetate; 3,5-difluorophenylacetate; penta-fluorophenylacetate; 2-chloro-6-fluorophenylacetate; 2-chloro-3,6-difluorophenylacetate; 3-chloro-2,6-difluorophenylacetate; 3-chloro-4-fluorophenylacetate; 5-chloro-2-fluorophenylacetate; 2,3,4-trifluorophenylacetate; 2,3,5-trifluorophenylacetate; 2,3,6-trifluorophenylacetate; 2,4,5-trifluorophenylacetate; 2,4,6-trifluorophenyl-acetate; 3,4,5-trifluorophenylacetate; 3-chloro-2-fluorophenylacetate; α-fluorophenylacetate; 4-chloro-2-fluorophenylacetate; 2-chloro-4-fluorophenylacetate; α,α-difluorophenylacetate; ethyl 2,2-difluoro-2-phenylacetate;

fluorinated or nonfluorinated acetates, for example methyl trifluoroacetate; allyl trifluoro-acetate; ethyl trifluoroacetate; isopropyl trifluoro-acetate; 2,2,2-trifluoroethyl trifluoroacetate; difluoroacetate; trifluoroacetate; methyl chlorodifluoro-acetate; ethyl bromodifluoroacetate; chlorodifluoro-acetate; ethyl chlorofluoroacetate; ethyl difluoro-acetate; 3-chlorophenyl difluoroacetate; 3,5-difluoro-phenyl difluoroacetate; 4-butylphenyl difluoroacetate; 4-tert-butylphenyl difluoroacetate; 3,4-dimethylphenyl difluoroacetate; 3-chloro-4-fluorophenyl difluoroacetate; 4-chlorophenyl difluoroacetate; 3',5'-difluorobiphenyl-2-yl acetate; 3',5'-difluorobiphenyl-3-yl acetate; 3',5'-difluorobiphenyl-4-yl acetate; 3',4'-difluorobiphenyl-2-yl acetate; 3',4'-difluorobiphenyl-3-yl acetate; 3',4'-difluorobiphenyl-4-yl acetate and 2,2-difluoropropionate.

These ligands have been found to be particularly suitable for rapid reaction. It is possible to obtain highly efficient phosphorescent layers with short processing times. It is also possible to use the higher homologs of these compounds. It is advantageously also possible to select any ligand of the complex from compounds specified above. It may additionally also be advantageous that every ligand of the complex corresponds to just one of the compounds specified above.

In an additional preferred embodiment of the process, the metal complex K may be a dinuclear metal complex. A particularly favorable arrangement may arise when the metal complex is present as a dinuclear metal complex in the layer. In this case, one or more ligands of the dinuclear complex may be replaced by the organic fluorescent emitter F, or the coordination sphere of the dinuclear complex may be extended by the incorporation of one or more organic emitters. In addition, one or more organic fluorescent emitters F may be arranged around the dinuclear complex in thermodynamically favorable positions. In this manner, it is possible, for example, for an organic fluorescent emitter F arranged within the complex to interact simultaneously with 2 metal atoms. This can contribute to particularly effective opening of the phosphorescence channel. The dinuclear complex may be either homo- or heteronuclear.

In addition, in a preferred embodiment of the process, the organic fluorescent emitters F may be selected from the group of the substituted or unsubstituted C6-C60 N-heteroaromatics. To obtain a maximum phosphorescence contribution of the organic fluorescent emitter and a maximum stability of association of the emitter with the heavy main group metal, it is particularly advantageously possible to use fluorescent emitters within this size range. In addition, these emitters can be deposited efficiently both from the liquid phase and from the gas phase. The individual molecules may be either fully aromatically through-conjugated or have some nonaromatic sections. In addition, these organic fluorescent emitters F, because of their size, may have sufficiently high diffusion coefficients, such that it is possible to obtain homogeneous layers within adequate processing times. More particularly, the N-heteroaromatics of this size also seem to be particularly suitable for occupying stable positions between the metal complexes.

In a further configuration of the process, the organic fluorescent emitters F may be selected from the group consisting of 4,7-di(9H-carbazol-9-yl)-1,10-phenanthroline, 2,6-bis(3-(9H-carbazol-9-yl)phenyl)pyridine, 3,5-bis(3-(9H-carbazol-9-yl)phenyl)pyridine, 2,8-di(9H-carbazol-9-yl)dibenzo[b,d]-thiophene, 2,2',2"-(1,3,5-benzenetriyl)-tris(1-phenyl-1H-benzimidazole), 2-(4-biphenylyl)-5-(4-tert-butylphenyl)-1,3,4-oxadiazole, 2,9-dimethyl-4,7-diphenyl-1,10-phenanthroline, 8-hydroxyquinolinolatolithium, 4-(naphthalen-1-yl)-3,5-diphenyl-4H-1,2,4-triazole, 1,3-bis[2-(2,2'-bipyridin-6-yl)-1,3,4-oxadiazol-5-yl]benzene, 4,7-diphenyl-1,10-phenanthroline, 3-(4-biphenylyl)-4-phenyl-5-tert-butylphenyl-1,2,4-triazole, bis(2-methyl-8-quinolinolato)-4-(phenylphenolato)aluminum, 6,6'-bis[5-(biphenyl-4-yl)-1,3,4-oxadiazol-2-yl]-2,2'-bipyridyl, 2-phenyl-9,10-di(naphthalen-2-yl)anthracene, 2,7-bis[2-(2,2'-bipyridin-6-yl)-1,3,4-oxadiazol-5-yl]-9,9-dimethylfluorene, 1,3-bis[2-(4-tert-butylphenyl)-1,3,4-oxadiazol-5-yl]benzene, 2-(naphthalen-2-yl)-4,7-diphenyl-1,10-phenanthroline, 2,9-bis (naphthalen-2-yl)-4,7-diphenyl-1,10-phenanthroline, tris(2,4,6-trimethyl-3-(pyridin-3-yl)phenyl)borane, 1-methyl-2-(4-(naphthalen-2-yl)phenyl)-1H-imidazo[4,5-f][1,10]phenanthroline, 1,3-bis(carbazol-9-yl)benzene, 1,3-bis(carbazol-9-yl)pyridine, 1,3,5-tris (carbazol-9-yl)benzene, 9-(3-(9H-carbazol-9-yl)-phenyl)-3-(4-(1-phenyl-1H-benzo[d]imidazol-2-yl)phenyl)-9H-carbazole, 2,6,14-tris(carbazol-9-yl)triptycene, 1,3-bis-(carbazol-9-yl)benzene, 1,3,5-tris(carbazol-9-yl)benzene, 3,5-di(9H-carbazol-9-yl)biphenyl, 9-(3,5-bis(diphenylphosphoryl)-phenyl)-9H-carbazole, bis[3,5-di(9H-carbazol-9-yl)phenyl]-diphenylsilane, 2,8-bis(diphenylphosphoryl)dibenzo[b,d]thio-phene, poly[3-(carbazol-9-yl)-9-(3-methyloxetan-3-ylmethyl)-carbazole], poly[3-(carbazol-9-ylmethyl)-3-methyloxetane]. These compounds have been shown to be particularly suitable for use as organic fluorescent emitters F, but without restriction. Both the electronic and steric properties of these compounds allow sufficient interactions with the heavy main group metals to "open" the phosphorescence channel with good internal quantum yields and long service life of the layers. Moreover, these compounds have sufficiently large aromatic regions, which can lead to suitable emission wavelengths.

The good interaction of the organic fluorescent emitters F can very probably also be attributed to their steric characteristics and here particularly to the suitable coordination sites to the metal atom. Moreover, these compounds have good processing in wet and in gas phase deposition processes.

Within an additional embodiment of the process, the organic fluorescent emitters F may be selected from the group consisting of 4,7-di(9H-carbazol-9-yl)-1,10-phenanthroline, 2,6-bis(3-(9H-carbazol-9-yl)phenylpyridine and 3,5-bis(3-(9H-carbazol-9-yl)phenyl)pyridine. More particularly, this group of organic fluorescent emitters F has been found to be suitable, within the scope of the process of the invention, for functioning as a phosphorescent ligand both within and outside the coordination sphere of the metal complex. These emitters seem apparently to have a suitable size which assures effective diffusion of these emitters. Furthermore, probably because of their electronic structure, these emitters can enable effective binding and coupling to the metal atoms. In this manner, within the scope of the process of the invention, effective and long-lived emitter layers are obtained. Particularly above-specified carbazole-bearing organic emitters can, very probably by virtue of their electronic HOMO/LUMO structure, exhibit only pure fluorescence emission at room temperature without coordination to a heavy main group metal from the above-specified group. After coordination or adduct formation with the main group metal, phosphorescent emissions are observable with high quantum yields. These are determined to a high degree by the electronic structure of the organic emitter and the remaining ligands of the complex. Layers having this emitter structure have been found to be particularly efficient and long-lived. The long life can probably be attributed to the size of the organic molecule and the low crystallization tendency thereof.

In a further preferred embodiment, the metal complex may contain a Bi(III) and at least one complex ligand from the group of the unsubstituted, partly fluorinated or perfluorinated organic carboxylic acids. The metal complex may preferably contain one, two or three of these organic carboxylic acids. Organic carboxylic acids may generally be selected from the group of the aliphatic saturated monocarboxylic acids; aliphatic unsaturated monocarboxylic acids; aliphatic saturated dicarboxylic acids; aliphatic saturated tricarboxylic acids; aliphatic unsaturated dicarboxylic acids; aromatic carboxylic acids; heterocyclic carboxylic acids; aliphatic unsaturated cyclic monocarboxylic acids. Particularly preferred partial or perfluorinated ligands L may be selected from substituted or unsubstituted compounds of acetic acid, phenylacetic acid and/or benzoic acid. It is more preferably possible to use nonfluorinated, partly fluorinated or perfluorinated acetic acid. In a further preferred embodiment, one or more polydentate ligands L, in the unevaporated state, may be arranged in a bridging position between the metal atoms of the complex. These compounds can be processed in a simple manner either from the wet phase or via a gas phase deposition process, and enable good binding of the fluorescent emitter in the layer. In this way, they can lead to long-lived emitter components having a very good quantum yield.

In a further aspect of the process, the metal complex may comprise one or more compounds from the group of the triaryl-bismuth(V) carboxylates. These compounds with Bi in the V oxidation state can be processed particularly easily by means of wet phase or gas phase deposition and enable good coordination of the organic fluorescent emitters to the central Bi atom. The layers thus obtained feature a high quantum yield and low crystallization tendency. This can increase the lifetime of the layers. The fluorination may cover just a single hydrogen atom up to and including a perfluorination of the compound. A preferred compound of this compound class is, for example, fully or partly fluorinated triphenylbismuth(V) bis(fluorobenzoate).

In a further preferred embodiment, the metal complex may be selected from the group consisting of Bi(III) triscarboxylate, Bi(III) fluoroacetate and Bi(III) trifluoroacetate. Specifically the coordination of the ligands via two oxygen atoms to the heavy main group metal can enable a facilitated alteration of the coordination sphere through the entry of the organic fluorescent emitter. By virtue of this configuration, it is possible to obtain particularly stable and efficient layers having long lifetimes.

A further part of the invention is an organic electrical component comprising at least one phosphorescent emitter layer, produced by the process of the invention. By means of the process of the invention, it is possible to produce layers in organic electrical components which are suitable for emission and conversion of light. As a result of the opening of the phosphorescence channel of the organic fluorescent emitters, these have a high quantum yield. Moreover, as a result of the nonstoichiometric composition of emitters and metal complexes, it may be possible to more accurately control absorption and emission characteristics of the layers. However, the phosphorescence properties of the layers are not obtained until the metal complexes and the organic fluorescent emitters are contacted with one another.

In addition, the layer of the invention may, as active layer in an organic electrical component, find use for conversion of electrical current to light, of light to electrical current and of light to light of another wavelength. The layer of the invention can accordingly be utilized for generation of power by absorption of light waves, and also for production of light by means of an electrical current. In addition, the layer can also be utilized for conversion of light waves to light waves of another wavelength. This can be done, for example, by absorption of quanta of light and release of quanta of light of another wavelength.

Another part of the invention is the use of the component of the invention as organic solar cell, organic transistor, a light-emitting organic component, an organic light-emitting diode and/or an organic light-emitting electrochemical cell.

The process described and layers producible thereby can find use correspondingly for absorbent components such as photodiodes or solar cells. In addition, the layers can also be used for photo conversion layers in photovoltaics or sensors. The process is compatible with the standard production steps for these components, and it is possible in this way to produce inexpensive, long-lived and efficient components.

With regard to further advantages and features of the above-described organic semiconductor components, reference is hereby made explicitly to the elucidations in connection with the layer of the invention and the process of the invention. Features of the invention and advantages of the process of the invention are also considered to be applicable and disclosed in respect of the layers of the invention and the organic semiconductor components of the invention, and vice versa. The invention also covers all combinations of at least two features disclosed in the description and/or the claims.

The above-described properties, features and advantages of this invention and the manner in which they are achieved will become clearer and more comprehensible in connection with the description of the working examples which follows, these being elucidated in detail in connection with the drawings.

The construction of components which can contain layers as per the process of the invention is shown in the figures which follow. The figures show:

FIG. 1 shows a schematic of the construction of an organic light-emitting diode 10. The light-emitting diode is formed from a glass layer 1; indium tin oxide ITO layer 2; hole injector layer 3; hole transport layer HTL 4; emitter layer EML 5; hole blocker layer HBL 6; electron transport layer ETL 7; electron injector layer 8 and a cathode layer 9; and FIG. 2 shows a schematic of the construction of an organic solar cell having PIN structure 20, which converts light 21 to electrical current. The solar cell consists of a layer of indium tin oxide 22, a p-doped layer 23; an absorption layer 24; a n-doped layer 25 and a metal layer 26.

Example

A prefabricated quartz substrate is treated by means of an oxygen plasma for 10 minutes and transferred as quickly as possible to an evaporator within an argon-filled glovebox having a water content of less than 2 ppm.

The thermal evaporation of the two layers is effected at a base pressure less than $2 \times 10^{-6}$ mbar, which is maintained over the entire vapor deposition step.

The metal complex and the organic emitter are heated in separate evaporators to a temperature just below their evaporation point. Subsequently, the metal complex is heated further until a constant rate of evaporation is achieved. The gate valve of the evaporator is opened and a first layer of the metal complex is deposited. Then the evaporator is closed again. Subsequently, the organic emitter is heated further until a constant rate of evaporation has been achieved. The gate valve of the evaporator is opened and a second layer of the organic emitter is deposited onto the first layer.

On completion of vapor deposition, the evaporator is flooded with dry argon.

A series of Bi:BUPH1 films with different composition is produced via the above-described coevaporation process. The ratio between metal complex and organic emitter was regulated via the layer thickness of the individual layers. Overall, 200 nm-thick Bi:BUPH1 films were deposited as emitter layers on a quartz glass. This means, for example, in the case of a ratio of 1:2, that the thickness of the layer which has been formed from the organic emitter is twice as great as the layer which has been formed from the metal complex. The reacting was effected at a temperature of 150° C. over a period of about 60 minutes. The following ratios were established (the abbreviation for bismuth(III) trifluoroacetate is $Bi(tfa)_3$ and that for Bi(III) pentafluorobenzoate is $Bi(pFBz)_3$):

| Compound | Ratio |
|---|---|
| $Bi(tfa)_3$:BUPH1 | 1:2 |
| $Bi(tfa)_3$:BUPH1 | 1:3 |
| $Bi(tfa)_3$:BUPH1 | 1:4 |
| $Bi(tfa)_3$:BUPH1 | 3:1 |
| $Bi(pFBz)_3$:BUPH1 | 1:1 |
| $Bi(pFBz)_3$:BUPH1 | 1:2 |
| $Bi(pFBz)_3$:BUPH1 | 1:3 |

The $Bi(tfa)_3$:BUPH1 and $Bi(pFBz)_3$:BUPH1 films deposited with different compositions were analyzed by means of TCSPC (time-correlated single photon counting) measurements in an inert atmosphere. At room temperature, the TCSPC measurement for the Bi:BUPH1 films gives complex lifetimes in the microsecond range. This is a clear indication of the presence of a phosphorescence transition. The complex lifetimes within this time domain can additionally indicate the presence of now phosphorescent emitters bound directly to the heavy metal atom and in the further environment.

Even though the invention has been illustrated and described in detail by the preferred working example, the invention is not restricted by the examples disclosed, and other variations can be derived therefrom by the person skilled in the art without leaving the scope of protection of the invention.

What is claimed is:

1. A process for producing phosphorescent emitter layers, the process comprising:
    providing a substrate;
    depositing a plurality of layers individually over the substrate, the plurality of layers including:
        at least one organic fluorescent emitter layer comprising an organic fluorescent emitter F; and at least one metal complex layer comprising a metal complex K comprising organic complex ligands L and at least one heavy main group metal M selected from the group consisting of In, Tl, Sn, Pb, Sb, and Bi; and
    reacting the deposited at least one organic fluorescent emitter F and at least one metal complex K with one another in a manner that changes a coordination sphere of the heavy main group metal M to incorporate the organic fluorescent emitter F.

2. The process of claim 1, wherein the reacting of the deposited at least one organic fluorescent emitter F and at least one metal complex K is effected by heating at a temperature of between 50° C. and 300° C., inclusive.

3. The process of claim 1, wherein a layer thickness ratio between the organic fluorescent emitter layer and metal complex layer prior to the reacting step is not less than 0.1 and not more than 15.

4. The process of claim 1, wherein the heavy main group metal M is Bi.

5. The process of claim 1, comprising depositing the individual layers repeatedly prior to the reacting, and
    wherein the number of individually deposited layers is between 3 and 100, inclusive.

6. The process of claim 1, wherein:
    at least one lower layer of the plurality of layers is deposited via an evaporation process; and
    at least one upper layer of the plurality of layers is deposited via a solvent process.

7. The process of claim 1, wherein the organic complex ligands L of the metal complex M are independently selected from the group consisting of halides and fluorinated or non-fluorinated C1-C30 alkyl or aryl carboxylates, alkoxides, thiolates, cyanates, isocyanates, thiocyanates, acetylacetonates, and sulfonates.

8. The process of claim 1, wherein the organic complex ligands L of the metal complex M are independently selected from the group consisting of fluorinated or non-fluorinated aliphatic C1-C30 carboxylates.

9. The process of claim 1, wherein the metal complex K comprises at least two different organic complex ligands L.

10. The process of claim 1, wherein the metal complex K comprises one or more compounds selected from the group consisting of Bi(III) triacetate, Bi(III) trifluoroacetate, Bi(III) tris-3,5-difluorobenzoate, Bi(III) tris-3,4,5-trifluorobenzoate, Bi(III) tris-2,3,5,6-tetrafluorobenzoate, Bi(III) tris-2,3,4,5,6-pentafluoro-benzoate, Bi(III) tris-2,3,5,6-tetrafluoro-4-trifluoro-methylbenzoate, Bi(III) tris-3,5-trifluoromethylbenzoate, Bi(III) pentafluorobenzoate, and Bi(III) 3,5-trifluoro-methylbenzoate.

11. The process of claim 1, wherein the metal complex K is a dinuclear metal complex.

12. The process of claim 1, wherein the organic fluorescent emitters F are selected from the group consisting of substituted or unsubstituted C6-C60 N-heteroaromatics.

13. The process of claim 1, wherein the organic fluorescent emitters F are selected from the group consisting of 4,5-di(9H-carbazol-9-yl)-1,10-phenanthroline, 2,6-bis(3-(9H-carbazol-9-yl)phenylpyridine, and 3,5-bis(3-(9H-carbazol-9-yl)phenyl)pyridine.

14. An organic electrical component, comprising:
    at least one phosphorescent emitter layer produced by a process including:
        providing a substrate;
        depositing a plurality of layers individually over the substrate, the plurality of layers including:
            at least one organic fluorescent emitter F; and
            at least one metal complex K comprising organic complex ligands L and at least one heavy main group metal M selected from the group consisting of In, Tl, Sn, Pb, and Bi; and
        reacting the deposited at least one organic fluorescent emitter F and at least one metal complex K with one another in a manner that changes a coordination sphere of the heavy main group metal M to incorporate the organic fluorescent emitter F.

15. The organic electrical component of claim 14, wherein the organic electrical component is an organic solar cell, an organic transistor, a light-emitting organic component, an organic light-emitting diode, or an organic light-emitting electrochemical cell.

* * * * *